United States Patent
Kwon et al.

(10) Patent No.: US 10,396,812 B2
(45) Date of Patent: Aug. 27, 2019

(54) DIGITAL REGISTER COMPONENT AND ANALOG-DIGITAL CONVERTER DETECTING SIGNAL DISTORTION IN HIGH-RADIATION ENVIRONMENTS

(71) Applicants: KOREA ATOMIC ENERGY RESEARCH INSTITUTE, Daejeon (KR); KOREA UNIVERSITY RESEARCH & BUSINESS FOUNDATION, Seoul (KR)

(72) Inventors: In Yong Kwon, Daejeon (KR); Yong Seok Lee, Seoul (KR); Jung Yeol Yeom, Seoul (KR); Chang Hwoi Kim, Daejeon (KR)

(73) Assignees: KOREA ATOMIC ENERGY RESEARCH INSTITUTE, Daejeon (KR); KOREA UNIVERSITY RESEARCH & BUSINESS FOUNDATION, Seoul (KR)

(*) Notice: Subject to any disclaimer, the term of this patent is extended or adjusted under 35 U.S.C. 154(b) by 0 days.

(21) Appl. No.: 16/000,599

(22) Filed: Jun. 5, 2018

(65) Prior Publication Data
US 2018/0367156 A1 Dec. 20, 2018

(30) Foreign Application Priority Data
Jun. 14, 2017 (KR) .......................... 10-2017-0075146

(51) Int. Cl.
*H03M 1/06* (2006.01)
*H03M 1/10* (2006.01)
(Continued)

(52) U.S. Cl.
CPC .......... *H03M 1/1009* (2013.01); *G06F 11/00* (2013.01); *H03K 3/037* (2013.01); *H03K 3/0372* (2013.01);
(Continued)

(58) Field of Classification Search
CPC ............. H03M 1/1009; H03M 1/0682; H03M 1/1071; H03K 3/037; G06F 11/00
(Continued)

(56) References Cited

U.S. PATENT DOCUMENTS

| 2007/0273440 A1 | 11/2007 | Wendt et al. |
| 2008/0258792 A1* | 10/2008 | Carlson ................. G11C 5/005 327/291 |

(Continued)

FOREIGN PATENT DOCUMENTS

| JP | 2001337168 A | 12/2001 |
| JP | 2010288091 A | 12/2010 |
| KR | 20050120779 A | 12/2005 |

*Primary Examiner* — Lam T Mai
(74) *Attorney, Agent, or Firm* — Mintz Levin Cohn Ferris Glovsky and Popeo, P.C.; Peter F. Corless (57) ABSTRACT

A register and an analog-digital converter capable of detecting signal distortion in high-radiation environments are provided. The register includes: a signal input terminal receiving a digital signal; and a digital single event transient (DSET) detection unit detecting whether information of the digital signal input through the signal input terminal is distorted, wherein the DSET detection unit includes a first output terminal through which a first detection signal is output, the first detection signal being used to determine whether at least one of rising edge timing information and falling edge timing information of the digital signal is distorted.

20 Claims, 11 Drawing Sheets

(51) Int. Cl.
*H03M 1/46* (2006.01)
*H03K 3/037* (2006.01)
*G06F 11/00* (2006.01)
*H03K 3/356* (2006.01)
*H03K 19/003* (2006.01)

(52) U.S. Cl.
CPC . *H03K 3/356121* (2013.01); *H03K 19/00338* (2013.01); *H03M 1/0682* (2013.01); *H03M 1/1071* (2013.01); *H03M 1/468* (2013.01)

(58) Field of Classification Search
USPC .................................................. 341/120–155
See application file for complete search history.

(56) References Cited

U.S. PATENT DOCUMENTS

| | | | | |
|---|---|---|---|---|
| 2010/0199006 A1* | 8/2010 | Takeuchi | ............ | G06F 13/4291 710/107 |
| 2015/0326211 A1* | 11/2015 | Hoshino | ................ | H02P 27/08 318/503 |
| 2018/0006564 A1* | 1/2018 | Zhong | .................. | H04W 76/23 |

* cited by examiner

PRIOR ART

DIGITAL REGISTER COMPONENT AND ANALOG-DIGITAL CONVERTER DETECTING SIGNAL DISTORTION IN HIGH-RADIATION ENVIRONMENTS

CROSS-REFERENCE TO RELATED APPLICATION(S)

This application claims benefit of priority to Korean Patent Application No. 10-2017-0075146 filed on Jun. 14, 2017 in the Korean Intellectual Property Office, the disclosure of which is incorporated herein by reference in its entirety.

This work was supported in part by Basic Science Research Program through the National Research Foundation of Korea (NRF) funded by the Ministry of Science and ICT (2016M2A8A1952801, 2016M2B2A9A02945226) and Korea Health Technology R&D Project through the Korea Health Industry Development Institute (KHIDI), funded by the Ministry of Health & Welfare, Republic of Korea (HI17C0654).

BACKGROUND

1. Field

The present disclosure relates to a device and an analog-digital converter, and more particularly, to a flip-flop and an analog-digital converter capable of detecting signal distortion in high-radiation environments.

2. Description of Related Art

In the defense industry, or in high-radiation environments, such as environments around nuclear reactors or accelerators, in space, or a fatal nuclear accident areas, circuits having radiation robustness for improved accuracy and reliability are used. In particular, analog-digital conversion circuits are necessary for converting analog signals into digital signals and performing additional processing operations, and thus the radiation resistance of such analog-digital conversion circuits is significant. For many years, circuitry techniques aimed at increasing the radiation resistance of analog-digital conversion circuits have been developed, and a typical example of such circuitry techniques is a redundancy technique in which a circuit portion having a key function is designed as a plurality of pairs to compare signals and select a correct signal not affected by radiation. For example, B. Olson has applied a redundancy method known as triple modular redundancy (TMR) to a comparator of a pipeline-type flip-flop circuit. In addition, double signal transmission paths have been designed in a digital-analog conversion circuit included in an analog-digital conversion circuit so as to enhance radiation resistance. Besides, algorithms for designing memories in a duplicated manner have been developed for system-level detection and correction of errors in high-radiation environments.

However, since such techniques of the related art basically use a redundancy method, the number of devices such as transistors, capacitors, or resistors is increased, and thus the area of such devices in an integrated circuit is increased. In addition, parasitic capacitors and resistors increase, thereby decreasing the speed and overall performance of a circuit. This waste in area and performance may not be endured because highly-improved speed, resolution, and power-consumption characteristics are required in the design stage. Such design goals may be achieved owing to ever more advanced lithography techniques for shorter channel transistor. However, since smaller devices use less current, smaller circuits are inevitably vulnerable to an ionizing radiation. Therefore, a significant amount of research has been conducted into developing new radiation resistance improving methods for overcoming such problems of existing radiation-resistant circuitry methods.

Figure 1:
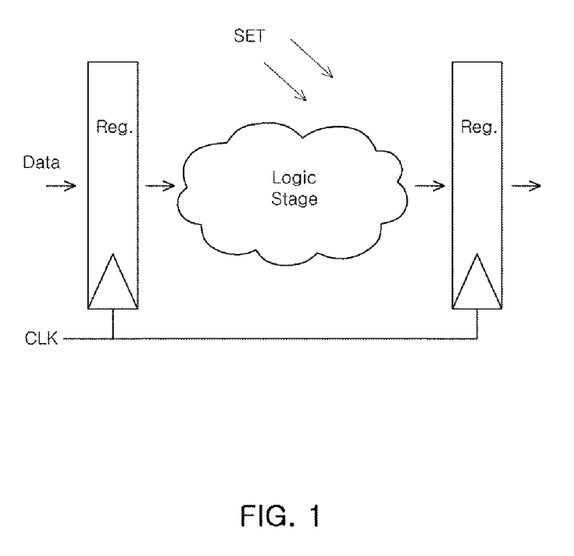
FIG. 1 is a schematic view illustrating registers and a logic stage of a digital circuit unit.

FIG. 1 is a schematic view illustrating registers and a logic stage of a digital circuit unit. Single event transients (SETs) and single event upsets (SEUs) refer to phenomena in which signal transmission and stored information are contaminated by external radiation, and are considered to be key factors in radiation-resistant circuit design. In particular, SETs are classified as digital SETs (DSETs) and analog SETs (ASETs) according to the position of a circuit on which radiation is incident, and in general, it is more difficult to correct SETs than SEUs in which digital bits are simply varied.

RELATED ART DOCUMENT (Patent Document 1) Japanese Patent No. 5354669

SUMMARY

Aspects of the present disclosure may provide a flip-flop and an analog-digital converter capable of individually detecting digital single event transients (DSET), analog single event transients (ASETs), and single event upsets (SEUs), and correcting corresponding data.

More particularly, aspects of the present disclosure may provide a flip-flop and an analog-digital converter applicable to a digital circuit requiring a flip-flop (for example, an analog-digital conversion circuit such as a successive approximation register analog-digital converter (SAR ADC)) for detecting variations in signals and information caused by radiation and regenerating a corresponding digital code by using a roll-back system.

According to an aspect of the present disclosure, an input stage of flip-flop detects signal distortion in high-radiation environments. The component may include: a signal input terminal receiving a digital signal; and a digital single event transient (DSET) detection unit detecting whether information of the digital signal input through the signal input terminal is distorted, wherein the DSET detection unit may include a first output terminal through which a first detection signal is output, the first detection signal being used to determine whether at least one of rising edge timing information and falling edge timing information of the digital signal is distorted.

In an embodiment, the DSET detection unit may further include a second output terminal through which a second detection signal is output, wherein the first detection signal may be used to determine whether the falling edge timing information of the digital signal is distorted, and the second detection signal may be used to determine whether the rising edge timing information of the digital signal is distorted.

In another embodiment, the component may further include a signal distortion determination unit determining, based on variations in the first detection signal or the second detection signal, whether at least one of the rising edge timing information and the falling edge timing information of the digital signal is distorted.

In another embodiment, the component may further include a roll-back instruction unit ordering regeneration of the digital signal according to results of the determination made by the signal distortion determination unit.

In another embodiment, the DSET detection unit may include: a first DSET detection portion including a first transistor and a second transistor; and a second DSET detection portion including a third transistor and a fourth transistor, wherein the first DSET detection portion may output the first detection signal through the first output terminal, and the second DSET detection portion may output the second detection signal through the second output terminal.

In another embodiment, the first transistor and the second transistor may be P-type field effect transistors; the third transistor and the fourth transistor may be N-type field effect transistors; the digital signal may be input to gates of the second and third transistors; a clock signal may be input to a gate of the first transistor; and an inverse of the clock signal may be input to a gate of the fourth transistor.

In another embodiment, the first output terminal may be connected to a drain of the first transistor and a source of the second transistor, and the first detection signal may have a high level as a default value.

In another embodiment, the capacitor may be added to a drain of the first transistor and a source of the second transistor against a large quantity of charge induced by high energy radiation.

In another embodiment, the second output terminal may be connected to a source of the third transistor and a drain of the fourth transistor, and the second detection signal may have a low level as a default value.

In another embodiment, the capacitor may be added to a source of the third transistor and a drain of the fourth transistor against a large quantity of charge induced by high energy radiation.

According to another aspect of the present disclosure, a flip-flop detects signal distortion in high-radiation environments. The component may include: a signal input terminal receiving a digital signal; and a single event upset (SEU) detection unit detecting whether information of the digital signal input through the signal input terminal is distorted, wherein the SEU detection unit may include a logic gate and capacitors.

In an embodiment, the SEU detection unit may further include an inverter loop, wherein the logic gate may receive both end signals of the inverter loop respectively through a first input terminal and a second input terminal.

In another embodiment, the SEU detection unit may further include two capacitors on the inverter loop which may inhibit the flips of logic values.

In another embodiment, the component may further include: a signal distortion determination unit determining, based on a detection signal output from the logic gate, whether signal distortion is caused by radiation; and a roll-back instruction unit ordering regeneration of the digital signal according to results of the determination made by the signal distortion determination unit.

In another embodiment, the inverter loop may include a first inverter and a second inverter, wherein the first input terminal of the logic gate may be connected to an input terminal of the first inverter and an output terminal of the second inverter, and the second input terminal of the logic gate may be connected to an output terminal of the first inverter and an input terminal of the second inverter.

According to another aspect of the present disclosure, an analog-digital converter detects signal distortion in high-radiation environments. The analog-digital converter may include: a first digital-analog converter portion; a second digital-analog converter portion; and an analog single event transient (ASET) detection unit receiving output signals of the first and second analog-digital converter portions respectively as a first input signal and a second input signal, wherein the ASET detection unit respectively compares the first and second input signals with a preset reference signal.

In an embodiment, the ASET detection unit may include: a first comparator outputting a first output signal by comparing the first input signal with the reference signal; and a second comparator outputting a second output signal by comparing the second input signal with the reference signal.

In another embodiment, the analog-digital converter may further include: a signal distortion determination unit comparing the first output signal with the second output signal to determine whether signal distortion is caused by radiation; and a roll-back instruction unit ordering regeneration of a digital signal according to results of the determination made by the signal distortion determination unit.

In another embodiment, the analog-digital converter may further include a successive approximation register (SAR) logic unit, wherein the SAR logic unit may detect whether digital signal information input to the SAR logic unit is distorted by a DSET or SEU.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Embodiments will not be described in detail in the following descriptions with reference to the accompanying drawings. Characteristics of the present disclosure, and implementation methods thereof will be clarified through the following descriptions given with reference to the accompanying drawings. The embodiments may, however, have different forms and should not be construed as being limited to the descriptions set forth herein. Rather, these embodiments are provided so that this disclosure will be thorough and complete, and will fully convey the scope of the present invention to those skilled in the art. Therefore, the scope of the present invention should be defined by the following claims. Throughout the present disclosure, like reference numerals denote like elements.

Figure 2:
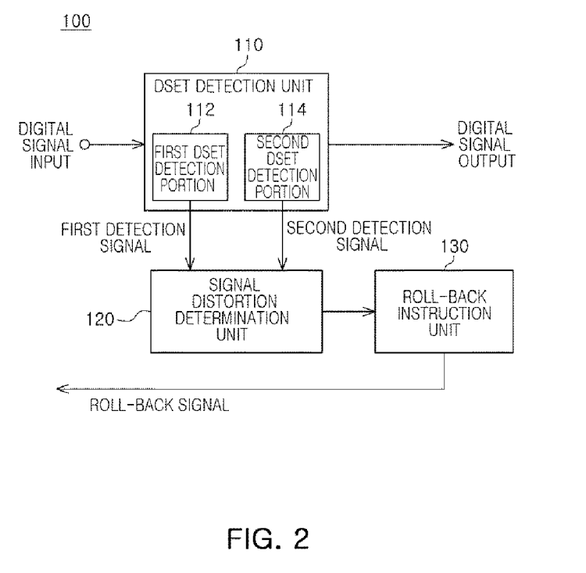
FIG. 2 is a block diagram illustrating a device detecting signal distortion in high-radiation environments according to an embodiment of the present disclosure.

FIG. 2 is a block diagram illustrating a device 100 detecting signal distortion in high-radiation environments according to an embodiment of the present disclosure. According to the embodiment of the present disclosure, the flip-flop 100 for detecting signal distortion in high-radiation environments includes a digital signal input terminal and a digital single event transient (DSET) detection unit 110. In addition, the flip-flop 100 may further include a signal distortion determination unit 120 and a roll-back instruction unit 130.

In the following embodiments, the term "unit," "portion," "module," or "table," or the suffix "-er" or "-or" is used to denote a software or hardware component such as a field-programmable gate array (FPGA) or application specific integrated circuit (ASIC), which performs certain tasks. However, these terms are not limited to a software or hardware component. A component denoted by such a term may be configured to reside on an addressable storage medium or configured to execute one or more processors. Thus, examples of such a component may include software components, object-oriented software components, components such as class components and task components, processes, functions, attributes, procedures, subroutines, segments of program code, drivers, firmware, microcode, circuitry, data, databases, data structures, tables, arrays, and variables. The functionality provided in components and modules may be combined into fewer components and modules or further separated into additional components and modules. In addition, the components and modules may be implemented such that they may execute one or more CPUs in a device.

The DSET detection unit 110 detects whether digital signal information input through the signal input terminal is distorted. A digital signal input through the signal input terminal has rising edge timing information and falling edge timing information, and if a DSET occurs in the digital signal due to radiation, the timing information or size information of the digital signal may be varied and transmitted to a following register. The DSET detection unit 110 is used to detect whether any one of the rising edge timing information and the falling edge timing information of the digital signal is distorted.

In detail, the DSET detection unit 110 may include at least one of a first DSET detection portion 112 and a second DSET detection portion 114. If the DSET detection unit 110 includes both the first DSET detection portion 112 and the second DSET detection portion 114, the first DSET detection portion 112 detects distortion in the rising edge timing information of the digital signal, and the second DSET detection portion 114 detects distortion in the falling edge timing information of the digital signal.

If the first DSET detection portion 112 detects distortion in the rising edge timing information of the digital signal, the first DSET detection portion 112 outputs a first detection signal through a first output terminal. In addition, if the second DSET detection portion 114 detects distortion in the falling edge timing information of the digital signal, the second DSET detection portion 114 outputs a second detection signal through a second output terminal. The first and second detection signals are transmitted to the signal distortion determination unit 120, and the signal distortion determination unit 120 determines, based on variations in the first and second detection signals, whether at least one of the rising edge timing information and the falling edge timing information of the digital signal is distorted. The signal distortion determination unit 120 transmits results of the determination to the roll-back instruction unit 130, and if the roll-back instruction unit 130 receives determination results reporting that at least one of the rising edge timing information and the falling edge timing information of the digital signal is distorted, the roll-back instruction unit 130 outputs a roll-back signal for regenerating the digital signal.

Figure 3:
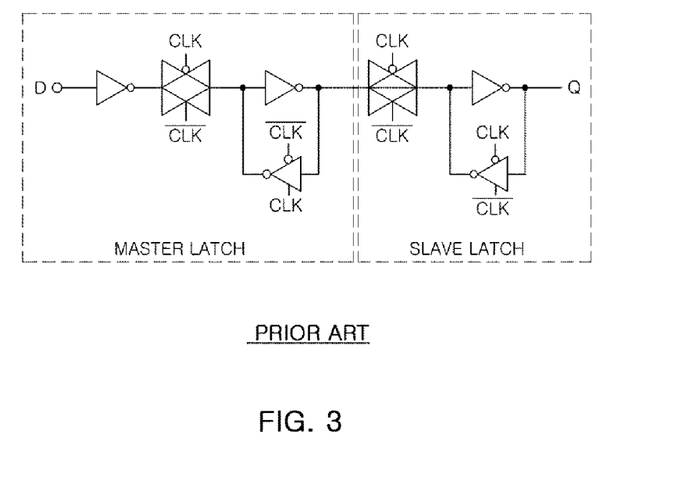
FIG. 3 is a circuit diagram illustrating a conventional D flip-flop of the related art.
Figure 4:
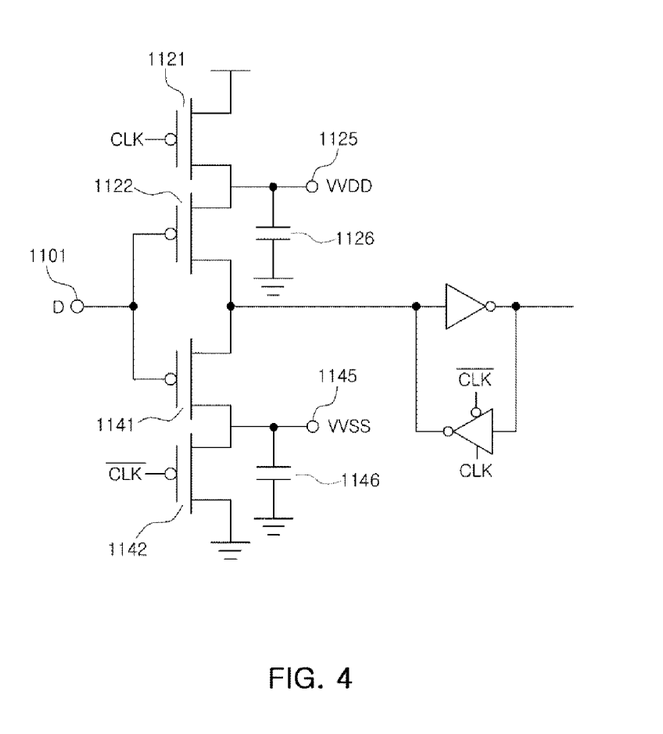
FIG. 4 is a view illustrating a circuit including a digital single effect transient (DSET) detection unit of the flip-flop for detecting signal distortion in high-radiation environments according to an embodiment of the present disclosure.

FIG. 3 is a circuit diagram illustrating an input stage of D flip-flop of the related art. Referring to a master latch portion in the D flip-flop of FIG. 3, when an input is applied to anode D from a previous operation, a first inverter applies a current to an inverter loop through a CMOS switch. FIG. 4 is a circuit diagram illustrating the DSET detection unit 110 of the flip-flop 100 for detecting signal distortion in high-radiation environments according to an embodiment of the present disclosure, in which a tristate buffer replaces the first inverter and the CMOS switch of the related-art flip-flop. Distortion in a digital signal caused by a DSET may be detected using a first detection signal and a second detection signal respectively output through a first output terminal and a second output terminal.

The circuit diagram of the DSET detection unit 110 of the flip-flop 100 for detecting signal distortion in high-radiation environments will now be described in more detail according to the embodiment of the present disclosure. The first DSET detection portion 112 may include a first transistor 1121 and a second transistor 1122, and the second DSET detection portion 114 may include a third transistor 1141 and a fourth transistor 1142. The first DSET detection portion 112 outputs a first detection signal through a first output terminal 1125, and the second DSET detection portion 114 outputs a second detection signal through a second output terminal 1145.

Referring to FIG. 4, in the circuit of the flip-flop 100 for detecting signal distortion in high-radiation environments according to the embodiment of the present disclosure, the first transistor 1121 and the second transistor 1122 may be P-type field effect transistors, and the third transistor 1141 and the fourth transistor 1142 may be N-type field effect transistors. In this case, a digital signal may be input to gates of the second transistor 1122 and the third transistor 1141, a clock signal may be input to a gate of the first transistor 1121, and the inverse of the clock signal input to the gate of the first transistor 1121 may be input to a gate of the fourth transistor 1142. In addition, the first output terminal 1125 may be connected to a drain of the first transistor 1121 and a source of the second transistor 1122, and the second output terminal 1145 may be connected to a source of the third transistor 1141 and a drain of the fourth transistor 1142. Moreover, a capacitor 1126, 1146 may be connected to each output terminal 1125, 1145 against a large quantity of charge induced by high energy radiation.

Figure 5:
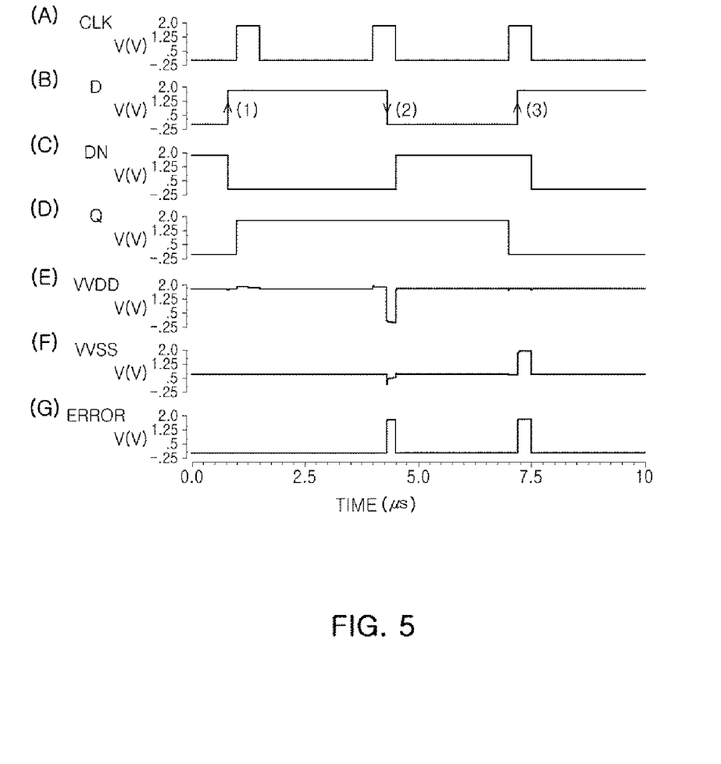
FIG. 5 is a simulation graph illustrating detection of DSETs using the flip-flop for detecting signal distortion in high-radiation environments according to an embodiment of the present disclosure.

FIG. 5 is a simulation graph illustrating detection of DSETs using the flip-flop 100 for detecting signal distortion in high-radiation environments according to an embodiment of the present disclosure. FIG. 5 illustrates waveforms A to G. The waveform A is a clock waveform input to the DSET detection unit 110, and the waveform B is a digital signal D input to a signal input terminal 1101.

According to given operational timing, a rising edge or a falling edge appears in the digital signal D input through the signal input terminal 1101 when the clock waveform. A is at a low level. For example, a first rising edge 1 appears in the waveform B when the waveform A is at the low level, and thus this rising edge timing information is correct timing information not containing DSET errors caused by radiation.

However, a falling edge 2 and a rising edge 3 appear when the clock waveform A is at a high level. That is, although it is intended to input these edges when the clock waveform A is at the low level, rising edge timing information or falling edge timing information of the digital signal D is distorted by DSET errors caused by radiation. When rising edge timing information or falling edge timing information of a digital signal is distorted as described above, a flip-flop of the related art may not detect such signal distortion caused by DSET errors. Although another method is used to detect signal distortion, technical problems are caused as described above in Background Art of the present disclosure.

According to the present disclosure, however, distortion of falling edge timing information of a digital signal is detected using a first detection signal VVDD (refer to FIG. 4). If falling edge timing information of the digital signal is distorted (the falling edge 2 in the waveform B), the DSET detection unit 110 of the embodiment outputs a first detection signal VVDD to the signal distortion determination unit 120. Referring to the circuit of the DSET detection unit 110 illustrated in FIG. 4, the first detection signal VVDD is output at a high level as a default state, and if signal distortion (the falling edge 2 in the waveform B) occurs because of a DSET, the first detection signal VVDD momentarily changes to a low level. This may be confirmed in the waveform E illustrated in FIG. 5. Moreover, the capacitor 1126 protects signal VVDD from a large quantity of charge induced by high energy radiation.

Similarly, according to the present disclosure, distortion of rising edge timing information of the digital signal is detected using a second detection signal VVSS (refer to FIG. 4). If rising edge timing information of the digital signal is distorted (the rising edge 3 in the waveform B), the DSET detection unit 110 of the embodiment outputs a second detection signal VVSS to the signal distortion determination unit 120. Referring to the circuit of the DSET detection unit 110 illustrated in FIG. 4, the second detection signal VVSS is output at a low level as a default state, and if signal distortion (the rising edge 3 in the waveform B) occurs because of a DSET, the second detection signal VVSS momentarily changes to a high level. This may be confirmed in the waveform F illustrated in FIG. 5. Moreover, the capacitor 1146 protects signal VVSS from a large quantity of charge induced by high energy radiation.

As described above, the signal distortion determination unit 120 determines, based on variations in the first detection signal VVDD or the second detection signal VVSS, whether at least one of the rising edge timing information or the falling edge timing information of the digital signal is distorted. For example, referring to the simulation graph of FIG. 5, the signal distortion determination unit 120 may determine that two errors have appeared, as shown in the waveform G. These two errors relate to the falling edge 2 and the rising edge 3 of the waveform B.

The roll-back instruction unit 130 outputs a roll-back signal to order regeneration of the digital signal according to results of determination by the signal distortion determination unit 120.

Figure 6:
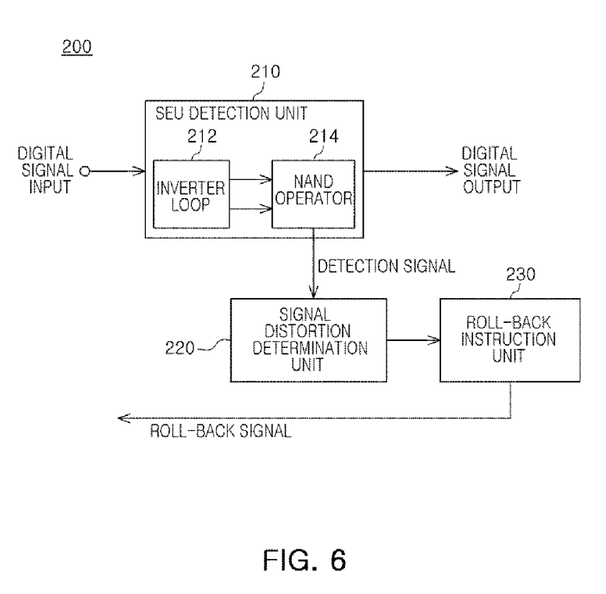
FIG. 6 is a block diagram illustrating a device detecting signal distortion in high-radiation environments according to another embodiment of the present disclosure.

FIG. 6 is a block diagram illustrating a device 200 detecting signal distortion in high-radiation environments according to another embodiment of the present disclosure.

According to the embodiment of the present disclosure, the flip-flop 200 for detecting signal distortion in high-radiation environments includes a digital signal input terminal and a single event upset (SEU) detection unit 210. In addition, the flip-flop 200 may further include a signal distortion determination unit 220 and a roll-back instruction unit 230. The SEU detection unit 210 includes a logic gate 214 and an inverter loop 212 and detects whether a digital signal input through the signal input terminal is distorted. SEU means information distortion occurring in a digital circuit and may occur when a stored digital value is varied by radiation incident on an inverter loop of a flip-flop used as a register. As the position of a flip-flop in which SEU occurs is close to the most significant bit (MSB), a larger error is produced.

Figure 7:
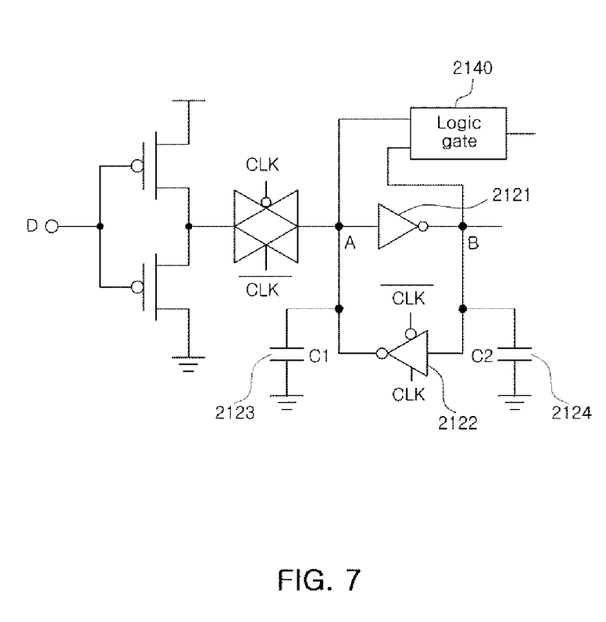
FIG. 7 is a block diagram illustrating a flip-flop detecting signal distortion in high-radiation environments according to another embodiment of the present disclosure.

FIG. 7 is a view illustrating a circuit illustrating the SEU detection unit 210 of the flip-flop 200 for detecting signal distortion in high-radiation environments according to the other embodiment of the present disclosure. In the flip-flop 200 for detecting signal distortion in high-radiation environments according to the embodiment of the present disclosure, the logic gate 214 of the SEU detection unit 210 may include a logic gate 2140, and the inverter loop 212 of the SEU detection unit 210 may include a first inverter 2121 and a second inverter 2122. Additionally, two capacitors 2123, 2124 on the inverter loop may inhibit the flips of logic values.

The logic gate 214 receives both end signals through a first input terminal and a second input terminal. The first input terminal of the logic gate 214 may be connected to an input terminal of the first inverter 2121 and an output terminal of the second inverter 2122, and the second input terminal of the logic gate 214 may be connected to an output terminal of the first inverter 2121 and an input terminal of the second inverter 2122.

The signal distortion determination unit 220 determines, based on a detection signal output from the logic gate 214, whether signal distortion is caused by radiation. The roll-back instruction unit 230 outputs a roll-back signal to order regeneration of a digital signal according to results of determination made by the signal distortion determination unit 220.

Figure 8:
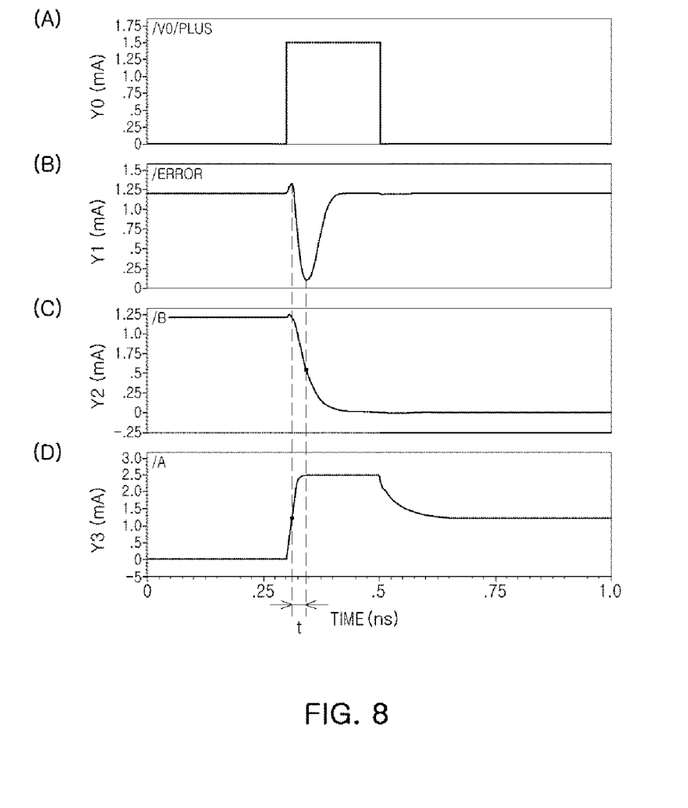
FIG. 8 is a simulation graph illustrating detection of a DSET using the flip-flop for detecting signal distortion in high-radiation environments according to the other embodiment of the present disclosure.

FIG. 8 is a simulation graph illustrating detection of a DSET using the flip-flop 200 for detecting signal distortion in high-radiation environments according to the other embodiment of the present disclosure. In FIG. 7, nodes A and B always have opposite logical values. However, if a charge is induced by incident radiation, the nodes A and B may momentarily have logical values (1, 1), and thus the logic gate 214 may output 0.

In FIG. 8, waveforms C and D are waveforms respectively measured at the nodes B and A, and due to a charge induced by SEU, both the nodes A and B momentarily have a high level for a time period (t). Thus, as shown by a waveform B in FIG. 8, a detection signal output from the logic gate 214 is momentarily at a low level. This variation in the detection signal is transmitted to the signal distortion determination unit 220. Then, the signal distortion determination unit 220 detects that signal distortion has occurred due to SEU, and according to results of determination made by the signal distortion determination unit 220, the roll-back instruction unit 230 outputs a roll-back signal to order regeneration of a digital signal.

Figure 9:
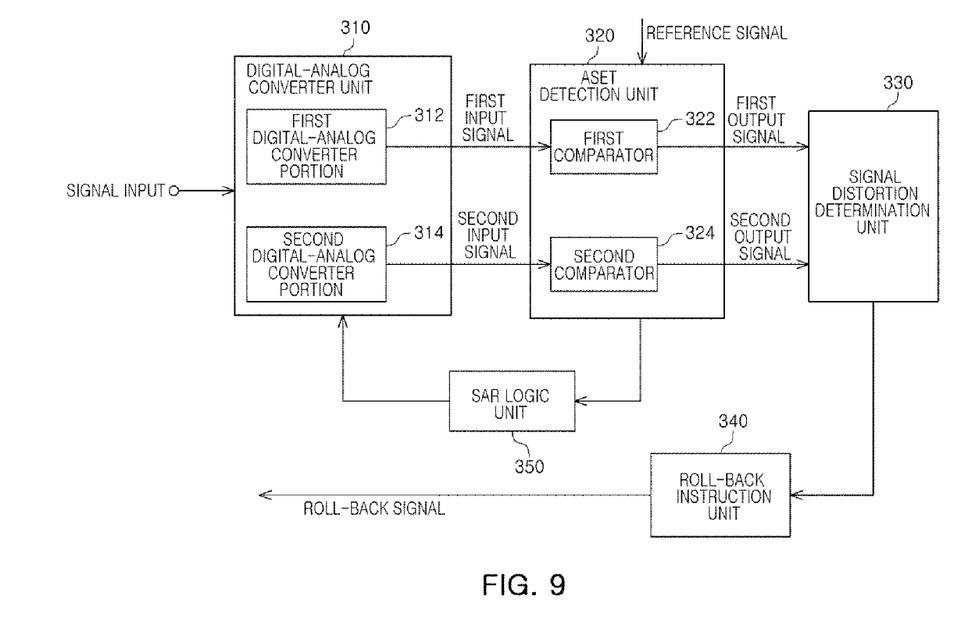
FIG. 9 is a block diagram illustrating an analog-digital converter detecting signal distortion in high-radiation environments according to an embodiment of the present disclosure.
Figure 10:
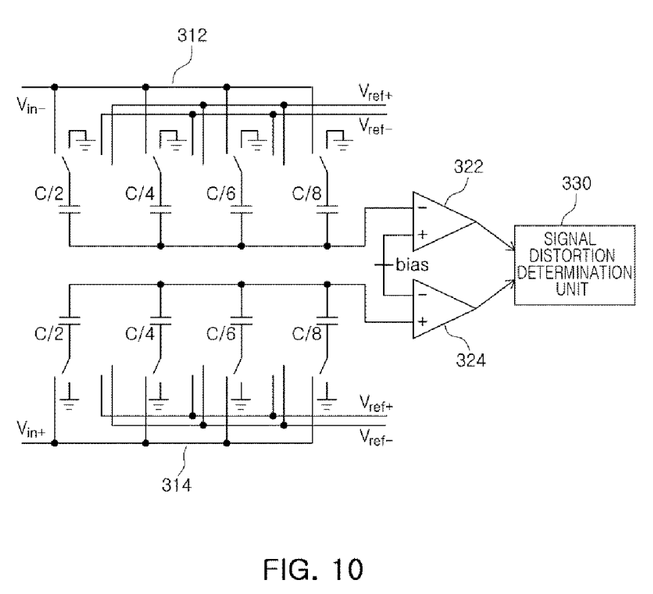
FIG. 10 is a circuit diagram illustrating a digital-analog converter unit and an analog single event transient (ASET) detection unit of the analog-digital converter for detecting signal distortion in high-radiation environments according to an embodiment of the present disclosure.

FIG. 9 is a block diagram illustrating an analog-digital converter 300 detecting signal distortion in high-radiation environments according to an embodiment of the present disclosure, and FIG. 10 is a circuit diagram illustrating a digital-analog converter unit 310 and an analog single event transient (ASET) detection unit 320 of the analog-digital converter 300 for detecting signal distortion in high-radiation environments according to an embodiment of the present disclosure.

According to the embodiment of the present disclosure, the analog-digital converter 300 for detecting signal distortion in high-radiation environments includes the digital-analog converter unit 310 and the ASET detection unit 320. In addition, the analog-digital converter 300 may further include a signal distortion determination unit 330, a roll-back instruction unit 340, and a successive approximation register (SAR) logic unit 350. The digital-analog converter unit 310 may include a first digital-analog converter portion 312 and a second digital-analog converter portion 314, and the ASET detection unit 320 may include a first comparator 322 and a second comparator 324.

According to the embodiment of the present disclosure, the analog-digital converter 300 for detecting signal distortion in high-radiation environments is basically made up of the digital-analog converter unit 310 and the two comparators 322 and 324. In detail, two signals respectively output from the first digital-analog converter portion 312 and the second digital-analog converter portion 314 are completely inverted analog signals if not distorted by an ASET. The two signals are input to the ASET detection unit 320, respectively as a first input signal and a second input signal.

The ASET detection unit 320 compares a preset reference signal respectively with the first and second input signals and outputs results of the comparison. In detail, the first comparator 322 outputs a first output signal by comparing the first input signal with the present reference signal, and the second comparator 324 outputs a second output signal by comparing the second input signal with the present reference signal.

In a general SAR analog-digital converter (SAR ADC), output values of two internal digital-analog converters (DACs) are input as two input values of a comparator and processed. In this case, however, signal distortion caused by an ASET in the internal DACs may not be detected. However, according to the present disclosure, an additional reference signal is provided to the ASET detection unit 320, and the first comparator 322 and the second comparator 324 compare a first input signal and a second input signal with the preset reference signal. The ASET detection unit 320 outputs result values of the comparison as a first output signal and a second output signal to the signal distortion determination unit 330.

According to this configuration of the present disclosure, whether signal distortion is caused by an ASET may be detected using the first and second output signals output from the ASET detection unit 320. That is, if signal distortion is not caused by an ASET, the first and second output signals have the same value. However, if any one of the first digital-analog converter portion 312 and the second digital-analog converter portion 314 undergoes signal distortion due to an ASET, the first and second output signals have different values.

Figure 11:
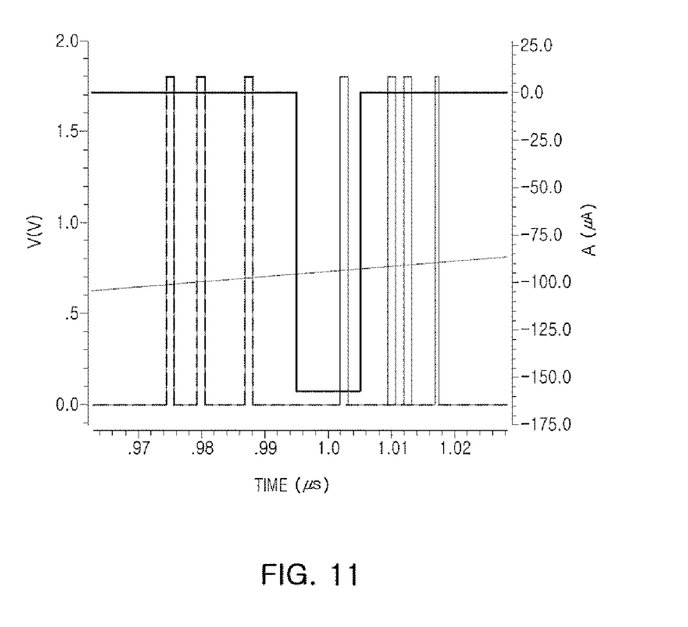
FIG. 11 is a simulation graph illustrating detection of an ASET using the analog-digital converter for detecting signal distortion in high-radiation environments according to an embodiment of the present disclosure.

FIG. 11 is a simulation graph illustrating detection of an ASET using the analog-digital converter 300 for detecting signal distortion in high-radiation environments according to an embodiment of the present disclosure. In FIG. 11, a first output signal (solid line) and a second output signal (dashed line) are illustrated. An ASET appears at about 1.0 second, and after the ASET, the first output signal (solid line) and the second output signal (dashed line) have different values.

The signal distortion determination unit 330 compares the first and second output signal to determine whether signal distortion is caused by radiation. If the first and second output signals have different values, the signal distortion determination unit 30 transmits a signal to the roll-back instruction unit 340 to report this difference, and the roll-back instruction unit 340 outputs a roll-back signal to order regeneration of a digital signal.

It is more difficult to detect an error caused by radiation in an analog circuit than in a digital circuit. Particularly, in a pipeline-type analog-digital conversion circuit, relatively many analog components such as amplifiers and comparators are distributed, and thus the area of analog circuit portions is large, making it difficult to detect errors. In the above description, an SAR ADC has been described as an example, and since the area of analog circuit portions in the SAR ADC is small, the possibility of ASETs may be low. The analog-digital converter 300 detecting signal distortion in high-radiation environments according to the embodiment of the present disclosure is not limited to the SAR ADC. However, if the analog-digital converter 300 detecting signal distortion in high-radiation environments according to the embodiment of the present disclosure is an SAR ADC, the analog-digital converter may further include the SAR logic unit 350 capable of detecting whether digital signal information input to the SAR logic unit 350 is distorted due to DSETs or SEU. That is, the SAR logic unit 350 may include the DSET detection unit 110 and the SEU detection unit 210 illustrated in FIGS. 2 and 6. In this case, since the method of detecting whether an input digital signal is distorted due to a DSET or SEU is described in detail with reference to the accompanying drawings such as FIGS. 2 and 4 to 8, a detailed description thereof will not be provided here.

As set forth above, the flip-flop and the analog-digital converter of the exemplary embodiments of the present disclosure may individually detect DSETs, ASETs, and SEUs and correct corresponding data. In other words, the flip-flop and the analog-digital converter may be applied to a digital circuit requiring a flip-flop for detecting variations in signals and information caused by radiation and regenerating a corresponding digital code by using a roll-back system.

While exemplary embodiments have been shown and described above, it will be apparent to those skilled in the art that modifications and variations could be made without departing from the scope of the present invention as defined by the appended claims. The exemplary embodiments should be considered in descriptive sense only and not for purposes of limitation. Therefore, the scope of the invention is defined not by the detailed description but by the appended claims, and all differences within the scope will be construed as being included in the present disclosure.

What is claimed is:

1. A device detecting signal distortion in high-radiation environments, the device comprising:
   a signal input terminal receiving a digital signal; and
   a digital single event transient (DSET) detection unit detecting whether information of the digital signal input through the signal input terminal is distorted,
   wherein the DSET detection unit comprises a first output terminal through which a first detection signal is output, the first detection signal being used to determine whether at least one of rising edge timing information and falling edge timing information of the digital signal is distorted.

2. The device of claim 1, wherein the DSET detection unit further comprises a second output terminal through which a second detection signal is output,
   wherein the first detection signal is used to determine whether the falling edge timing information of the digital signal is distorted, and the second detection signal is used to determine whether the rising edge timing information of the digital signal is distorted.

3. The device of claim 2, further comprising a signal distortion determination unit determining, based on variations in the first detection signal or the second detection signal, whether at least one of the rising edge timing information and the falling edge timing information of the digital signal is distorted.

4. The device of claim 3, further comprising a roll-back instruction unit ordering regeneration of the digital signal according to results of the determination made by the signal distortion determination unit.

5. The device of claim 2, wherein the DSET detection unit comprises:
   a first DSET detection portion comprising a first transistor, a second transistor and a capacitor; and
   a second DSET detection portion comprising a third transistor, a fourth transistor and a capacitor,
   wherein the first DSET detection portion outputs the first detection signal through the first output terminal, and the second DSET detection portion outputs the second detection signal through the second output terminal.

6. The device of claim 5, wherein the first transistor and the second transistor are P-type field effect transistors,
   the third transistor and the fourth transistor are N-type field effect transistors,
   the digital signal is input to gates of the second and third transistors, and
   a clock signal is input to a gate of the first transistor, and an inverse of the clock signal is input to a gate of the fourth transistor.

7. The device of claim 6, wherein the first output terminal is connected to a drain of the first transistor and a source of the second transistor, and
   the first detection signal has a high level as a default value.

8. The device of claim 6, wherein the second output terminal is connected to a source of the third transistor and a drain of the fourth transistor, and
   the second detection signal has a low level as a default value.

9. A device detecting signal distortion in high-radiation environments, the device comprising:
   a signal input terminal receiving a digital signal; and
   a single event upset (SEU) detection unit detecting whether information of the digital signal input through the signal input terminal is distorted,
   wherein the SEU detection unit comprises a logic gate and comparators.

10. The device of claim 9, wherein the SEU detection unit further comprises an inverter loop,
    wherein the logic gate receives both end signals of the inverter loop respectively through a first input terminal and a second input terminal.

11. The device of claim 10, further comprising:
    a signal distortion determination unit determining, based on a detection signal output from the logic gate, whether signal distortion is caused by radiation; and
    a roll-back instruction unit ordering regeneration of the digital signal according to results of the determination made by the signal distortion determination unit.

12. The device of claim 10, wherein the inverter loop comprises a first inverter and a second inverter,
    wherein the first input terminal of the logic gate is connected to an input terminal of the first inverter and an output terminal of the second inverter, and
    the second input terminal of the logic gate is connected to an output terminal of the first inverter and an input terminal of the second inverter.

13. The device of claim 9, wherein the SEU detection unit further comprises an inverter loop,
    wherein two capacitors on both end signals of the inverter loop may inhibit flips of logic values.

14. An analog-digital converter detecting signal distortion in high-radiation environments, the analog-digital converter comprising:
    a first digital-analog converter portion;
    a second digital-analog converter portion; and
    an analog single event transient (ASET) detection unit receiving output signals of the first digital-analog converter portion and the second digital-analog converter portion respectively as a first input signal and a second input signal,
    wherein the ASET detection unit respectively compares the first input signal and the second input signal with a preset reference signal.

15. The analog-digital converter of claim 14, wherein the ASET detection unit comprises:
    a first comparator outputting a first output signal by comparing the first input signal with the preset reference signal; and
    a second comparator outputting a second output signal by comparing the second input signal with the preset reference signal.

16. The analog-digital converter of claim 15, further comprising:
    a signal distortion determination unit comparing the first output signal with the second output signal to determine whether signal distortion is caused by radiation; and
    a roll-back instruction unit ordering regeneration of a digital signal according to results of the determination made by the signal distortion determination unit.

17. The analog-digital converter of claim 14, further comprising a successive approximation register (SAR) logic unit,
    wherein the SAR logic unit detects whether digital signal information input to the SAR logic unit is distorted by a DSET or SEU.

18. The device of claim 1, which detects or inhibits signal distortion by additional charges induced from radiation impact events.

19. The device of claim 9, which detects or inhibits signal distortion by additional charges induced from radiation impact events.

20. The analog-digital converter of claim 14, which detects or inhibits signal distortion by additional charges induced from radiation impact events.

* * * * *